United States Patent
Yuan et al.

(10) Patent No.: US 11,334,110 B1
(45) Date of Patent: May 17, 2022

(54) SYSTEMS AND METHODS FOR COMMUNICATING CLOCK SIGNALS

(71) Applicant: Cadence Design Systems, Inc., San Jose, CA (US)

(72) Inventors: Xiaobin Yuan, Cary, NC (US); Aida Varzaghani, Portola Valley, CA (US); Irina Gavshina, Durham, NC (US); Mouna Safi-Harab, Montreal (CA)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 17/164,321

(22) Filed: Feb. 1, 2021

(51) Int. Cl.
 *G06F 1/10* (2006.01)
 *G06F 1/08* (2006.01)
 *H03L 7/07* (2006.01)

(52) U.S. Cl.
 CPC .................. *G06F 1/10* (2013.01); *G06F 1/08* (2013.01); *H03L 7/07* (2013.01)

(58) Field of Classification Search
 CPC ..... G06F 1/04; G06F 1/06; G06F 1/08; G06F 1/10; H03K 5/133; H03K 5/135; H03L 7/06; H03L 7/07; H03L 7/0891; H03L 7/0814; H03L 7/087; H03L 7/093; H03L 7/0812; H03L 7/18; H03L 7/0807; H03L 7/0995; H03L 7/0802
 See application file for complete search history.

(56) References Cited

U.S. PATENT DOCUMENTS

| | | | |
|---|---|---|---|
| 7,581,131 B1* | 8/2009 | Prasad | G06F 1/12 713/400 |
| 2004/0145397 A1* | 7/2004 | Lutkemeyer | G06F 3/002 327/158 |
| 2006/0220721 A1* | 10/2006 | Vig | H03K 5/133 327/261 |
| 2012/0268182 A1* | 10/2012 | Lee | H03K 3/356121 327/299 |
| 2015/0109036 A1* | 4/2015 | Gomm | H03K 5/1565 327/158 |
| 2017/0262011 A1* | 9/2017 | Kwon | G06F 1/12 |
| 2020/0028495 A1* | 1/2020 | Song | H03K 3/037 |

* cited by examiner

*Primary Examiner* — John W Poos
(74) *Attorney, Agent, or Firm* — Tarolli, Sundheim, Covell & Tummino LLP (57) ABSTRACT

In some examples, a circuit can include a first buffer circuit that can be configured to receive a first clock signal and a first output voltage. The first buffer circuit can be configured to operate in a first voltage domain based on the first output voltage. The circuit can include a second buffer circuit configured to receive a second clock signal, the second buffer circuit being configured to operate in a second voltage domain based on the second output voltage. The first voltage domain can be different from the second voltage domain. In some examples, one of the first and second buffer circuits can be configured to provide one of the first and second clock signals as a clock output signal at a clock output terminal in response to a clock enable signal.

20 Claims, 7 Drawing Sheets

SYSTEMS AND METHODS FOR COMMUNICATING CLOCK SIGNALS

TECHNICAL FIELD

The present disclosure relates to systems and methods for communicating clock signals. In some examples, the present disclosure relates to a clock receiver circuit.

BACKGROUND

The operation of circuits, such as a microprocessor, digital signal processor (DSP), and other integrated circuits (ICs) requires a clock signal for operation. The clock signal can be generated by a clock generator, which in some instances, can be obtained using a phase-locked loop (PLL). A PLL clock generator includes a voltage-controlled oscillator (VCO) and a phase/frequency detector to receive an external reference input signal combined with a feedback input signal from the VCO. The PLL clock generator further includes a charge pump and a loop filter circuit connected in series between the phase/frequency detector and VCO. To generate the clock signal, a first divider circuit of the PLL clock generator receives the VCO output and supplies the feedback input to the phase-frequency detector. A second divider circuit of the PLL clock generator circuit also receives the VCO output and generates the clock signal. To distribute the clock signal, a clock distribution network can be used to provide circuits with the clock signal for operation.

SUMMARY

The present disclosure relates to systems and methods for communicating clock signals.

In an example, a circuit can include a first buffer circuit that can be configured to receive a first clock signal and a first output voltage. The first buffer circuit can be configured to operate in a first voltage domain based on the first output voltage. The circuit can include a second buffer circuit configured to receive a second clock signal. The second buffer circuit can be configured to operate in a second voltage domain based on the second output voltage. The first voltage domain can be different from the second voltage domain. In some examples, one of the first and second buffer circuits can be configured to provide one of the first and second clock signals as a clock output signal at a clock output terminal in response to a clock enable signal.

In yet another example, a system can include a clock transmitter circuit that can be configured to generate first and second clock signals based on a master clock signal. The system can include a clock receiver circuit that can include a clock output terminal, a first buffer circuit, and a second buffer circuit. The first buffer circuit can be configured to operate in a first voltage domain and can be configured to receive the first clock signal. The second buffer circuit can be configured to operate in a second voltage domain and can be configured to receive the second clock signal. One of the first and second buffer circuits can be configured to provide one of the first and second clock signals as a clock output signal at the clock output terminal in response to a clock enable signal.

In a further example, a method can include receiving during a first period of time a first clock signal at a first buffer circuit operating in a first power domain, receiving during the first period of time a second clock signal at a second buffer circuit operating in a second power domain, receiving during the first period of time at the first buffer circuit a first clock enable signal, providing during the first period of time at a clock output terminal of the clock receiver circuit the first clock signal in response to receiving the first clock enable signal and receiving during a second period of time at the second buffer circuit a second clock enable signal. The method can further include providing during the second period of time at the clock output terminal of the clock receiver circuit the second clock signal in response to receiving the second clock enable signal.

DETAILED DESCRIPTION

The present disclosure relates to systems and methods for communicating clock signals. Clock receiver circuits are used in data communication systems for enabling normal operation of circuits. Generally, a clock transmitter circuit (a master clock circuit) is used to generate clock signals at different frequencies. The clock transmitter circuit is configured to provide the clock signals to respective lanes (or channels) that run through multiple clock receiver circuits that are coupled to a respective data interface circuit of a data communication system. The respective data interface circuit can be a Serializer-Deserializer (SerDes) circuit. The lanes can be conductive paths (e.g., traces) over which a respective clock signal can be transmitted. For example, a first set of conductive paths can originate at the clock transmitter circuit and terminate at a first clock receiver circuit. The clock transmitter circuit can be configured to communicate the clock signals over a respective conduct path of the first set of conductive paths to the first clock receiver circuit.

The first clock receiver circuit is configured to receive the clock signals and re-transmit the clock signals along a second set of conductive paths that originates at the first clock receiver circuit and terminates at a second clock receiver circuit. The second clock receiver circuit can be configured to receive the clock signals and re-transmit the clock signals along a subsequent set of conductive paths that originate at the second clock receiver circuit and terminate at a subsequent clock receiver circuit, or a terminating circuit. Each of the first and second clock receiver circuits can be configured to provide a respective clock signal selected from the received clock signals to the respective data interface circuit. The respective clock signal can be used by the SerDes circuit for clocking of a transmitter and a receiver of the SerDes circuit. Thus, in some examples, the respective clock signal can be used to synchronize transfer of data between the SerDes circuit and another device, such as another SerDes circuit or another circuit (e.g., a processor).

Because the clock signals are transmitted over neighboring conductive paths crosstalk can occur. Crosstalk occurs when one signal is affected by a neighboring signal, such as a result of capacitive coupling between two neighboring signals. The crosstalk between the clock signals causes jitters to be induced in at least one of the clock signals being transmitted along the conductive paths. Additionally, a power supply source for enabling operation of the clock receiver circuit can induce jitters in the at least one clock signal. Power supply influences a propagation delay by affecting both a switching voltage threshold of logic gates of a respective clock receiver circuit as well as an output resistance. As such, variations in the clock signals from crosstalk and power supply induced jitters can reduce a performance of the SerDes circuit (e.g., causing the SerDes circuit to not operate properly) as the respective clock signal received by the SerDes circuit deviates from an expected clock signal.

In some examples, a clock receiver circuit is described herein that minimizes crosstalk and supply induced jitters in clock signals at the clock receiver circuit. The clock receiver circuit can be configured to operate buffer circuits according to a different voltage domain. The term "voltage domain" as used herein can refer to an operating voltage for enabling circuitry to operate (e.g., turn-on). Each buffer circuit of the clock receiver circuit can include a buffer stage and a clock selector circuit. The buffer stage of each buffer circuit can be configured to buffer a respective clock signal and provide the respective clock signal downstream to a subsequent clock receiver circuit or a terminating circuit. For example, a first buffer stage of a first buffer circuit can be configured to buffer a first clock signal, and a second buffer stage of a second buffer circuit can be configured to buffer a second clock signal. Each clock signal can be provided by a clock transmitter circuit, which is located upstream from the clock receiver circuit. The clock selector circuit of each buffer circuit can be configured to select the respective clock signal and provide the respective clock signal at a clock output terminal in response to a respective clock enable signal.

For example, a first clock selector circuit of the first buffer circuit can be configured to provide the first clock signal at the clock output terminal as a clock output signal in response to receiving a first clock enable signal. In some examples, a second clock selector circuit of the second buffer circuit can be configured to provide the second clock signal at the clock output terminal as the clock output signal in response to receiving a second clock enable signal. In some examples, the SerDes circuit is coupled to the clock output terminal to receive the clock output signal. Because the clock receiver circuit can be configured to provide clock signals with different frequencies, the SerDes circuit can be configured to operate at a different data rate (e.g., transmission data rate) based on a frequency of the clock output signal.

The clock receiver circuit can be configured to receive different output voltages, which can be generated by a respective voltage source circuit. The different output voltages can be used by the clock receiver circuit to operate the buffer circuits in different voltage domains. For example, a first output voltage provided by a first voltage source circuit can be used to operate the first buffer circuit in a first voltage domain and a second output voltage provided by a second voltage source circuit can be used to operate the second buffer circuit in a second voltage domain. By operating each of the first and second buffer circuits in different voltage domains, the first and second buffer circuits can be electrically isolated, thereby reducing crosstalk and power supply induced jitters in the first and second clock signals at the clock receiver circuit.

Figure 1:
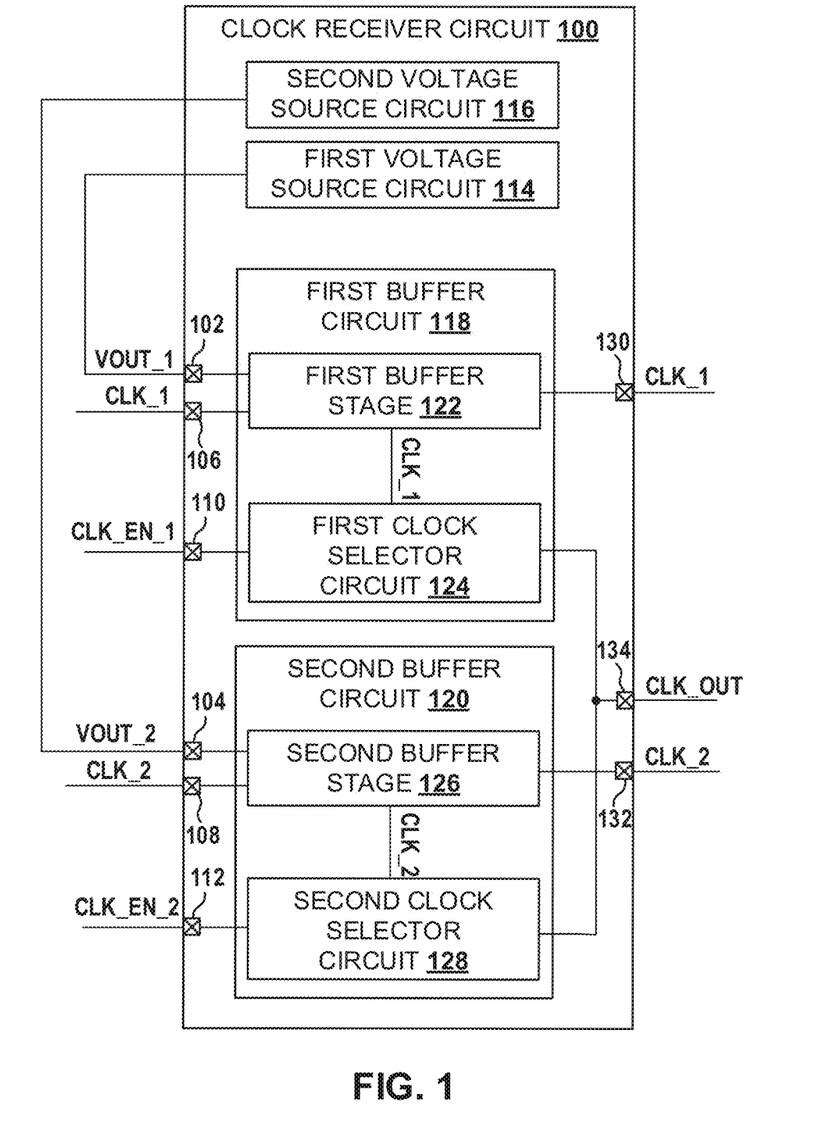
FIG. 1 is an example of a clock receiver circuit.

FIG. 1 is an example of a clock receiver circuit 100. The clock receiver circuit 100 can be implemented in a Field Programmable Gate Array (FPGA) device or an integrated circuit (e.g., an application-specific integrated circuit (ASIC) or system-on-chip (SoC)). The clock receiver circuit 100 can be employed in a data communication system. For example, the clock receiver circuit 100 can be used for clocking a data interface circuit of the data communication system, thereby enabling the data interface circuit to operate. For example, the data interface circuit can be a SerDes circuit. The clock receiver circuit 100 can be used to clock the data interface circuit, thereby enabling the data interface circuit to convert data (e.g., from a serial to a parallel data stream or a parallel to the serial data stream) and transmit and/or receive data properly. The data interface circuit can be configured to transmit the serial data stream at a transmission rate based on a clock output signal (labeled as "CLK_OUT" in FIG. 1) provided by the clock receiver circuit 100. In some examples, the data interface circuit can be configured to vary the transmission rate (e.g., from about 1 Gigabits per second (Gbs) to about 112 Gbs), thereby enabling the SerDes circuit to change a rate at which the serial data stream is transmitted. The transmission rate of the data interface circuit can be set based on the clock output signal provided by the clock receiver circuit 100, which can be configured to provide clock output signals with different clock frequencies as described herein.

The clock receiver circuit 100 includes a first input terminal 102, a second input terminal 104, a third input terminal 106, a fourth input terminal 108, a fifth input terminal 110, and a sixth input terminal 112. The first input terminal 102 can be configured to receive a first output voltage (labeled as "VOUT_1" in FIG. 1). The first output voltage can be generated by a first voltage source circuit 114. The second input terminal 104 can be configured to receive a second output voltage (labeled as "VOUT_2" in FIG. 1). The second output voltage can be generated by a second voltage source circuit 116. In some examples, the first and second voltage source circuits 114 and 116 can be representative of voltage regulators configured to provide different output voltages. Thus, the first voltage source circuit 114 can be configured to provide the first output voltage with a first voltage magnitude (e.g., an amplitude), and the second voltage source circuit 116 can be configured to provide the second output voltage with a second voltage magnitude. The first voltage magnitude can be different from the second voltage magnitude. In the example of FIG. 1 the clock receiver circuit 100 includes the first and second voltage source circuit 114 and 116. However, in other examples, the first and second voltage circuits 114 and 116 can be outside to the clock receiver circuit 100.

In some examples, the third input terminal 106 can be configured to receive a first clock signal (labeled as "CLK_1" in FIG. 1) and the fourth input terminal 108 can be configured to receive a second clock signal (labeled as "CLK_2" in FIG. 1). Each of the first and second clock signals can be generated by a clock transmitter circuit (e.g., a master PLL clock generator). The first and second clock signals can have a different frequency. In some examples, the fifth input terminal 110 can be configured to receive a first clock enable signal (labeled as "CLK_EN_1" in FIG. 1). In other examples, the sixth input terminal 112 can be configured to receive a second clock enable signal (labeled as "CLK_EN_2" in FIG. 1). Each of the first and second clock enable signals can be provided by a controller (e.g., a microcontroller). For example, in a computing system, the controller can be a central processing unit (CPU) or graphic processing unit (GPU).

In some examples, the clock receiver circuit 100 includes a first buffer circuit 118 and a second buffer circuit 120. The first buffer circuit 118 can be configured to receive the first output voltage. The first output voltage can be used to operate the first buffer circuit in a first voltage domain. The second buffer circuit 120 can be configured to receive the second output voltage. The second output voltage can be used to operate the second buffer circuit in a second voltage domain. The first buffer circuit 118 can include a first buffer stage 122 and a first clock selector circuit 124. Respective first and second inputs of the first buffer stage 122 can be coupled to one of the first and third input terminals 102 and 106. A first input of the first clock selector circuit 124 can be coupled to the fifth input terminal 110. The first buffer stage 122 and the first clock selector circuit 124 can be operated according to first output voltage. The second buffer circuit 120 can include a second buffer stage 126 and a second clock selector circuit 128. Respective first and second inputs of the second buffer stage 126 can be coupled to one of the second and fourth input terminals 104 and 108. An input of the second clock selector circuit 128 can be coupled to the sixth input terminal 112. The second buffer stage 126 and the second clock selector circuit 128 can be operated according to second output voltage. By operating each of the first and second buffer circuits 118 and 120 in different voltage domains, the first and second buffer circuits 118 and 120 can be electrically isolated, thereby reducing crosstalk and power supply induced jitters in the output clock signals at the clock receiver circuit 100.

In some examples, the first buffer stage 122 can be configured to buffer the first input clock signal to a first output terminal 130. A first output of the first buffer stage 122 can be coupled to the first output terminal 130. In some examples, a second output of the first buffer stage 122 can be coupled to a second input of the first clock selector circuit 124. The first buffer stage 122 can be configured to provide the first input clock signal to the first clock selector circuit 124. In some examples, the first clock selector circuit 124 can be configured to pass the first input clock signal to the output. In some examples, the second buffer stage 126 can be configured to buffer the second input clock signal to a second output terminal 132. A first output the second buffer stage 126 can be coupled to the second output terminal 132. In some examples, a second output of the second buffer stage 126 can be coupled to a second input of the second clock selector circuit 128. The second buffer stage 126 can be configured to provide the first input clock signal to the second clock selector circuit 128. In some examples, the second clock selector circuit 128 can be configured to pass the second input clock signal to the output.

In some examples, the clock receiver circuit 100 includes a third output terminal 134. Respective outputs of the first and second clock selector circuits 124 and 128 can be coupled to the third output terminal 134. In some examples, the first clock selector circuit 124 can be configured to pass the first clock signal to the third output terminal 134 (e.g., during a first period of time) as the clock output signal in response to receiving the first clock enable signal. In some examples, the second clock selector circuit 128 can be configured to pass the second clock signal to the third output terminal 134 (e.g., during a second period of time) as the clock output signal in response to receiving the second clock enable signal. In some examples, the SerDes circuit can be coupled to the third output terminal 134 to receive the clock output signal. Because the clock receiver circuit 100 can be configured to provide clock signals with different frequencies, the SerDes circuit can be operated at different data rates based on a respective frequency of the clock output signal, which is based on the frequency of one of the first and second clock signals. While in the example of FIG. 1 the clock receiver circuit 100 is configured with two buffer circuits, in other examples, the clock receiver circuit 100 can includes more than two buffer circuits. In the other examples, the clock receiver circuit 100 can be configured to receive two or more clock signals at different clock frequencies and pass one of the two more clock signals to the clock output signal at the third output terminal 134 based on a respective clock enable signal. Accordingly, by operating each of the first and second buffer circuits 118 and 120 in different voltage domains, the first and second buffer circuits 118 and 120 can be electrically isolated, thereby reducing crosstalk and power supply induced jitters in the first, second, and output clock signals at the clock receiver circuit 100.

Figure 2:
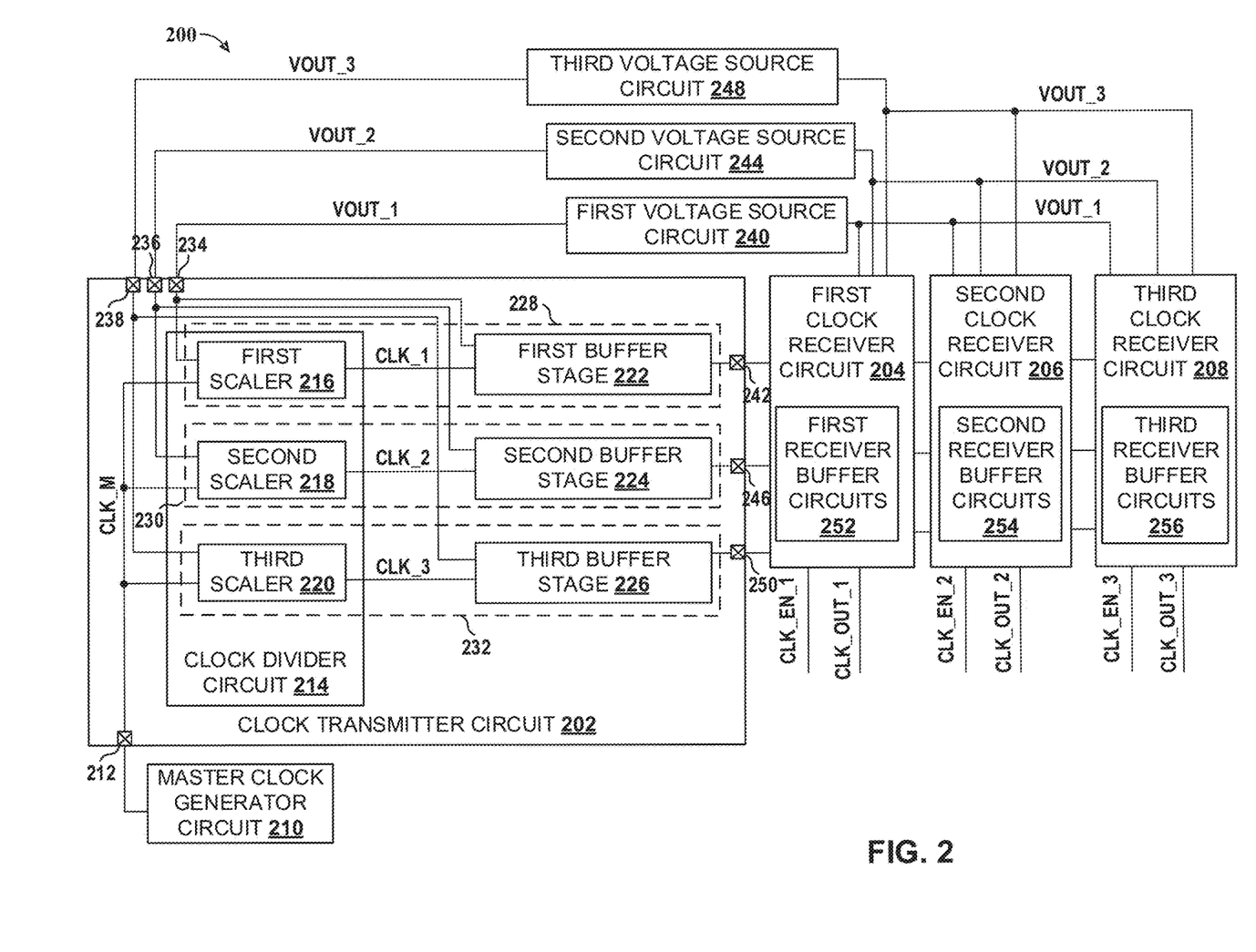
FIG. 2 is an example of a clock communication circuit.

FIG. 2 is an example of a clock communication system 200. The clock communication system 200 includes a clock transmitter circuit 202, a first clock receiver circuit 204, a second clock receiver circuit 206, and a third clock receiver circuit 208. In some examples, the first, second, and third clock receiver circuits 204, 206, and 208 can be configured in a same or similar manner as the clock receiver circuit 100, as shown in FIG. 1. Thus, in some examples, references can be made to the example of FIG. 1 in the following description of FIG. 2. The clock communication system 200 can be used in a data communication system. For example, the clock communication system 200 can be used for clocking SerDes circuits of the data communication system, thereby enabling the SerDes circuits to operate. Each clock receiver circuit 204, 206, and 208 can be used to clock a respective SerDes circuit, thereby enabling the respective SerDes circuit to convert data (e.g., from a serial to a parallel data stream or a parallel to the serial data stream) and transmit and/or receive data properly.

By way of example, the clock communication system 200 includes a master clock generator circuit 210. The master clock generator circuit 210 can be configured to generate a master clock signal (labeled as "CLK_M" in FIG. 2) having a master clock frequency. In some examples, the master clock generator circuit 210 can be implemented as a PLL. In further examples, the clock transmitter circuit 202 can include the master clock generator circuit 210. In other examples, the master clock generator circuit 210 can be implemented according to a different circuit architecture to provide to the master clock signal. The clock transmitter circuit 202 includes a first input terminal to receive the master clock signal. The clock transmitter circuit 202 includes a clock divider circuit 214. The clock divider circuit 214 can be configured to generate a plurality of clock signals with different frequencies based on the master clock signal. For example, the plurality of clock signals can include a first clock signal (labeled as "CLK_1" in FIG. 2), a second clock signal (labeled as "CLK_2" in FIG. 2), and a third clock signal (labeled as "CLK_3" in FIG. 2). The clock divider circuit 214 can include a first scaler 216, a second scaler 218, and a third scaler 220. Each of the scalers 216, 218, and 220 can be configured to receive the master clock signal and scale (e.g., frequency divide) the master clock signal to provide the first, second, and third clock signals. Thus, in some examples, each of the first, second, and third scalers 216, 218, and 220 can be configured to generate a respective clock signal with a clock frequency that is a fraction of the master clock frequency. The clock transmitter circuit 202 includes a first buffer stage 222, a second buffer stage 224, and a third buffer stage 226. The first, second and third buffer stages 222, 224, and 226 can be configured similar to one of the first or second buffer stages 122 and 126, as shown in FIG. 1.

In some examples, the first scaler 216 and the first buffer stage 222 can be operated in a first voltage domain 228. The second scaler 218 and the second buffer stage 224 can be operated in a second voltage domain 230. The third scaler 220 and the third buffer stage 226 can be operated in a third voltage domain 232. By operating the first scaler 216 and the first buffer stage 222 in a different voltage domain than the second scaler 218 and the second buffer stage 224 that is also operated in a different voltage domain from the third scaler 220 and the third buffer stage 226, a respective scaler and buffer stage can be electrically isolated from remaining scaler and buffer stages. By electrically isolating respective scalers 216, 218, and 220 and buffer stages 222, 224, and 226 crosstalk and power induced jitters can be reduced or minimized in the first, second and/or third clock signals at the clock transmitter circuit 202.

In some examples, the clock transmitter circuit 202 includes a second input terminal 234, a third input terminal 236, and a fourth input terminal 238. The second input terminal 234 can be configured to receive a first output voltage (labeled as "VOUT_1" in FIG. 2). The first output voltage can be generated by a first voltage source circuit 240. The first voltage source circuit 240 can be similar to the first voltage source circuit 114, as shown in FIG. 1. Respective first inputs of the first scaler 216 and the first buffer stage 222 can be coupled to the second input terminal 234 to receive the first output voltage. The first output voltage can be used to operate the first scaler 216 and the first buffer stage 222 in the first voltage domain 228. A second input of the first scaler 216 can be coupled to the first input terminal 212 to receive the master clock signal. While being operated in the first voltage domain 228, the first scaler 216 can be configured to scale the master clock signal to provide the first clock signal. An output of the first scaler 216 can be coupled to a second input of the first buffer stage 222 to provide the first buffer stage 222 with the first clock signal. While being operated in the first voltage domain 228, the first buffer stage 222 can be configured to buffer the first clock signal and provide the first clock signal. An output of the first buffer stage 222 can be coupled to a first output terminal 242 to provide the first clock signal at the first output terminal 242.

In some examples, the third input terminal 236 can be configured to receive a second output voltage (labeled as "VOUT_2" in FIG. 2). The second output voltage can be generated by a second voltage source circuit 244. The second voltage source circuit 244 can be similar to the second voltage source circuit 116, as shown in FIG. 1. Respective first inputs of the second scaler 218 and the second buffer stage 224 can be coupled to the third input terminal 236 to receive the second output voltage. The second output voltage can be used to operate the second scaler 218 and the second buffer stage 224 in the second voltage domain 230. A second input of the second scaler 218 can be coupled to the first input terminal 212 to receive the master clock signal. While being operated in the second voltage domain 230, the second scaler 218 can be configured to scale the master clock signal to provide the second clock signal. An output of the second scaler 218 can be coupled to a second input of the second buffer stage 224 to provide the second buffer stage 224 with the second clock signal. While being operated in the second voltage domain 230, the second buffer stage 224 can be configured to buffer the second clock signal and provide the second clock signal. An output of the second buffer stage 224 can be coupled to a second output terminal 246 to provide the second clock signal at the second output terminal 246.

In some examples, the fourth input terminal 238 can be configured to receive a third output voltage (labeled as "VOUT_3" in FIG. 2). The third output voltage can be generated by a third voltage source circuit 248. The third voltage source circuit 248 can be different from the second voltage source circuit 244, which can be different from the first voltage source circuit 240. Thus, each of the first, second, and third voltage source circuits 240, 244, and 248 can be configured to generate a different output voltage, such that respective scalers 216, 218, and 220 and buffer stages 222, 224, and 226 can be operated in one of the first, second and third voltage domains 228, 230, and 232.

In some examples, respective first inputs of the third scaler 220 and the third buffer stage 226 can be coupled to the fourth input terminal 238 to receive the third output voltage. The third output voltage can be used to operate the third scaler 220 and the third buffer stage 226 in the third voltage domain 232. A second input of the third scaler 220 can be coupled to the first input terminal 212 to receive the master clock signal. While being operated in the third voltage domain 232, the third scaler 220 can be configured to scale the master clock signal to provide the third clock signal. An output of the third scaler 220 can be coupled to a second input of the third buffer stage 226 to provide the third buffer stage 226 with the third clock signal. While being operated in the third voltage domain 232, the third buffer stage 226 can be configured to buffer the third clock signal and provide the third clock signal. An output of the third buffer stage 226 can be coupled to a third output terminal 250 to provide the third clock signal at the third output terminal 250.

In some examples, each of the first and second, and third clock signals can be provided to the first clock receiver circuit 204. In some examples, the first clock receiver circuit 204 can be configured to include first receiver buffer circuits 252. The first receiver buffer circuits 252 can include buffer circuits for each of the first, second, and third clock signals. The buffer circuits of the first receiver buffer circuits 252 can be similar to one of the first or second buffer circuits 118 or 120, as shown in FIG. 1. Thus, each buffer circuit of the first receiver buffer circuits 252 can include a buffer stage and a clock selector circuit. Each buffer circuit of the first receiver buffer circuits 252 can be electrically isolated by operating each buffer circuit in a respective power domain based on a respective voltage in a same or similar manner as described herein with respect to FIG. 1. By operating each buffer circuit of the first receiver buffer circuits 252 in a respective power domain, crosstalk and power supply induced jitters are minimized in the first, second, and third clock signals at the first clock receiver circuit 204. A first buffer circuit of the first receiver buffer circuits 252 for processing the first clock signal can be operated in the first voltage domain 228. A second buffer circuit of the first receiver buffer circuits 252 for processing the second clock signal can be operated in the second voltage domain 230. A third buffer circuit of the first receiver buffer circuits 252 for processing the third clock signal can be operated in the third voltage domain 232.

In some examples, the clock selector circuit of the respective buffer circuit of the first receiver buffer circuits 252 can be configured to pass the first clock signal as a first clock output signal (labeled as "CLK_OUT_1" in FIG. 2) based on a first clock enable signal (labeled as "CLK_EN_1" in FIG. 2). The clock selector circuit of the respective buffer circuit of the first clock receiver circuit 204 can be configured to pass the first clock signal to the first clock output signal in response to the first clock enable signal in a same or similar manner as the first clock selector circuit 124 as described herein. In some examples, the first clock output signal can be provided to a first SerDes circuit of the data communication system. The first SerDes circuit can include a transmitter and a receiver. Each of the transmitter and receiver of the first SerDes circuit can include a local clock generator (e.g., a PLL local clock generator) that can be configured to generate a respective local clock signal based on the first clock output signal. In some examples, the first receiver buffer circuits 252 can be configured to provide the first, second and third clock signals to the second clock receiver circuit 206. For example, the buffer stages of the first receiver buffer circuits 252 can be configured to buffer and communicate a respective one of the first, second and third clock signals to the second clock receiver circuit 206.

In some examples, the second clock receiver circuit 206 can be configured to include second receiver buffer circuits 254. The second receiver buffer circuits 254 can be configured in a same or similar manner as the first receiver buffer circuits 252. Thus, each buffer circuit of the second receiver buffer circuits 254 can include a buffer stage and a clock selector circuit. Each buffer circuit of the second receiver buffer circuits 254 can be electrically isolated by operating each buffer circuit in a respective power domain based on a respective voltage in a same or similar manner as described herein with respect to FIG. 1. By operating each buffer circuit of the second receiver buffer circuits 254 in a respective power domain, crosstalk and power supply induced jitters are minimized in the first, second, and third clock signals at the second clock receiver circuit 206. A first buffer circuit of the second receiver buffer circuits 254 for processing the first clock signal can be operated in the first voltage domain 228. A second buffer circuit of the second receiver buffer circuits 254 for processing the second clock signal can be operated in the second voltage domain 230. A third buffer circuit of the second receiver buffer circuits 254 for processing the third clock signal can be operated in the third voltage domain 232.

In some examples, the clock selector circuit of the respective buffer circuit of the second receiver buffer circuits 254 can be configured provide the second clock signal as a second clock output signal (labeled as "CLK_OUT_2" in FIG. 2) based on a second clock enable signal (labeled as "CLK_EN_2" in FIG. 2). The clock selector circuit of the respective buffer circuit of the second clock receiver circuit 206 can be configured to provide the second clock signal as the second clock output signal based on the second clock enable signal in a same or similar manner as the second clock selector circuit 128 as described herein. In some examples, the second clock output signal can be provided to a second SerDes circuit of the data communication system. The second SerDes circuit can include a transmitter and a receiver. Each of the transmitter and receiver of the second SerDes circuit can include a local clock generator (e.g., a PLL local clock generator) that can be configured to generate a respective local clock signal based on the second clock output signal. In some examples, the second receiver buffer circuits 254 can be configured to provide the first, second and third clock signals to the third clock receiver circuit 208. For example, the buffer stages of the second receiver buffer circuits 254 can be configured to buffer and communicate a respective one of the first, second and third clock signals to the third clock receiver circuit 208.

In some examples, the third clock receiver circuit 208 can include third receiver buffer circuits 256. By way of example, the third receiver buffer circuits 256 can be configured in a same or similar manner as one of the first or second receiver buffer circuits 252 and 254. Thus, each buffer circuit of the third receiver buffer circuits 256 can include a buffer stage and a clock selector circuit. Each buffer circuit of the third receiver buffer circuits 256 can be electrically isolated by operating each buffer circuit in a respective power domain based on a respective voltage in a same or similar manner as described herein with respect to FIG. 1. By operating each buffer circuit of the third receiver buffer circuits 256 in a respective power domain, crosstalk and power supply induced jitters are minimized in the first, second, and third clock signals at the third clock receiver circuit 208. A first buffer circuit of the third receiver buffer circuits 256 for processing the first clock signal can be operated in the first power voltage 228. A second buffer circuit of the third receiver buffer circuits 2546 for processing the second clock signal can be operated in the second voltage domain 230. A third buffer circuit of the third receiver buffer circuits 256 for processing the third clock signal can be operated in the third voltage domain 232.

In some examples, the clock selector circuit of the respective buffer circuit of the third receiver buffer circuits 256 can be configured provide the third clock signal as a third clock output signal (labeled as "CLK_OUT_3" in FIG. 2) based on a third clock enable signal (labeled as "CLK_EN_3" in FIG. 2). The clock selector circuit of the respective buffer circuit of the third clock receiver circuit 208 can be configured to provide the third clock signal as the third clock output signal based on the third clock enable signal in a same or similar manner as one of the first or second clock selector circuits 124 or 128 as described herein. In some examples, the third clock output signal can be provided to a third SerDes circuit of the data communication system. The third SerDes circuit can include a transmitter and a receiver. Each of the transmitter and receiver of the third SerDes circuit can include a local clock generator (e.g., a PLL local clock generator) that can be configured to generate a respective local clock signal based on the third clock output signal. In some examples, the third receiver buffer circuits 256 can be configured to provide the first, second and third clock signals to a subsequent clock receiver circuit or a terminating circuit. For example, the buffer stages of the third receiver buffer circuits 256 can be configured to buffer and communicate a respective one of the first, second and third clock signals to the subsequent clock receiver circuit or the terminating circuit. In some examples, the third clock receiver circuit 208 includes the terminating circuit. Accordingly, operating respective circuits (e.g., a respective scaler and a buffer stage) within the clock transmitter circuit 202 and respective first, second, and third clock receiver circuits in different voltage domains 228, 230, and 232 reduces an amount of crosstalk and power supply induced jitters in the first, second, and third clock signals.

Figure 3:
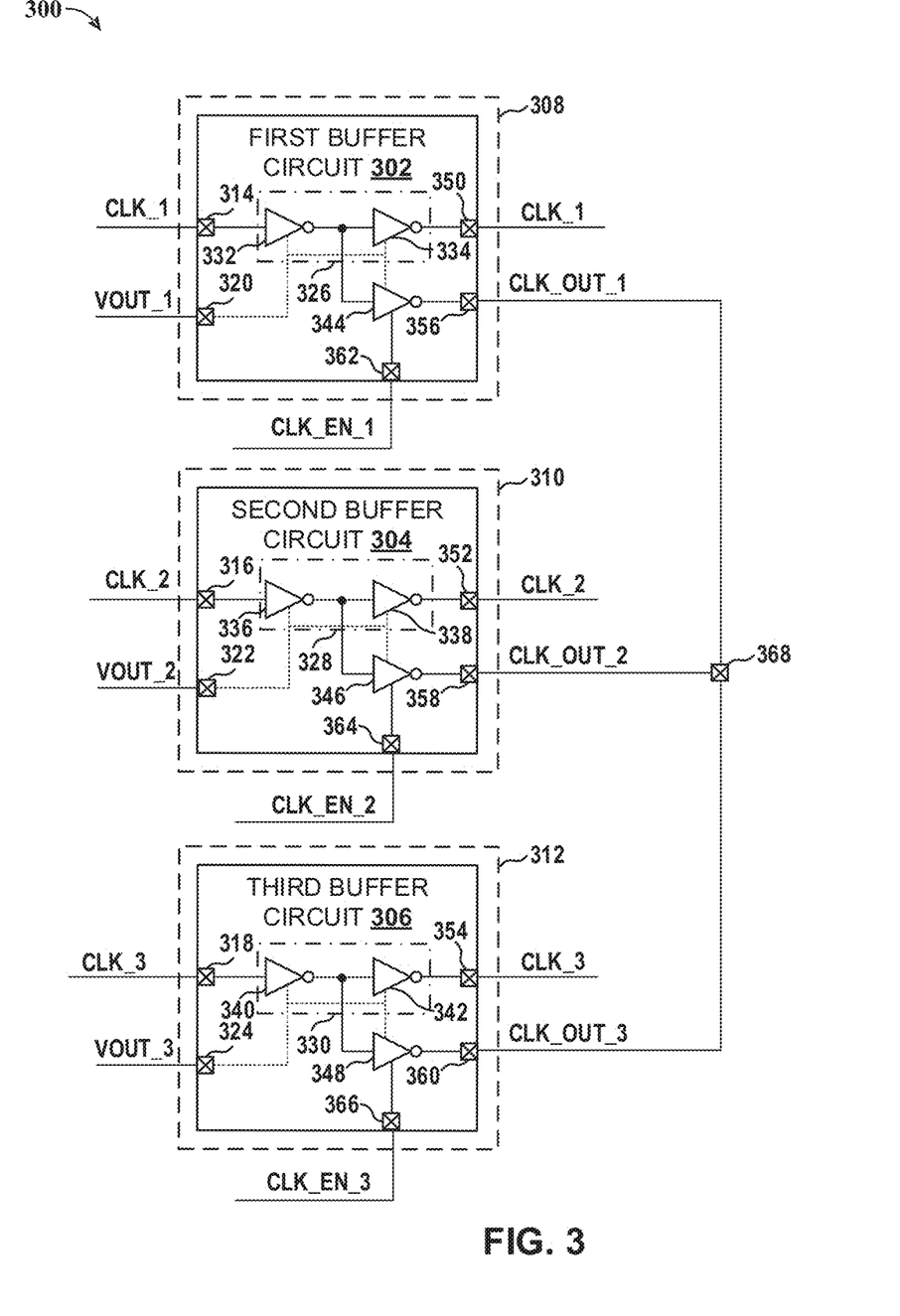
FIG. 3 is an example of another clock receiver circuit.

FIG. 3 is an example of a clock receiver circuit 300. In some examples, the clock receiver circuit 300 can correspond to the clock receiver circuit 100, as shown in FIG. 1, or at least one of the clock receiver circuits 204, 206, and 208, as shown in FIG. 2. Thus, in some examples, references can be made to the example of FIG. 1 or 2 in the following description of FIG. 3. The clock receiver circuit 300 includes a first buffer circuit 302, a second buffer circuit 304, and a third buffer circuit 306. Each of the first, second and third buffer circuits 302, 304, and 306 can be configured to operate in a respective power domain 308, 310, and 312. Operating the first, second and third buffer circuits 302, 304, and 306 in the respective power domain 308, 310, and 312 can reduce and in some instances eliminates crosstalk between clock signals and power supply induced jitters in the clock signals. The respective power domains 308, 310, and 312 can be similar to the first, second and third power domains 228, 230, and 232, as shown in FIG. 2.

By way of example, each of the first, second and third buffer circuits 302, 304, and 306 can be configured to receive at a respective first input terminal 314, 316, and 318 a respective one of a first clock signal (labeled as "CLK_1" in FIG. 3), a second clock signal (labeled as "CLK_2" in FIG. 3), and a third input signal (labeled as "CLK_3") in FIG. 3). The first, second, and third clock signals can be generated by the clock transmitter circuit 202, as shown in FIG. 2. As shown in FIG. 3, each of the first, second and third buffer circuits 302, 304, and 306 can include a respective second input terminal 320, 322, and 324 to receive a first output voltage (labeled as "VOUT_1" in FIG. 3), a second output voltage (labeled as "VOUT_2" in FIG. 3), and a third output voltage (labeled as "VOUT_3" in the FIG. 3). Each of the first, second, and third output voltages can be generated by a respective voltage source circuit, such as the first, second, and third voltage source circuits 240, 244, and 248, as shown in FIG. 2. Thus, each of the first, second, and third output voltages can be a different output voltage.

The first output voltage can be used at the first buffer circuit 302 to power circuitry therein to enable the first buffer circuit 302 to buffer and provide the first clock signal. The second output voltage can be used at the second buffer circuit 304 to power circuitry therein to enable the second buffer circuit 304 to buffer and provide the second clock signal. The third output voltage can be used at the third buffer circuit 306 to power circuitry therein to enable the third buffer circuit 306 to buffer and provide the second clock signal. Because each of the first, second and third buffer circuits 302, 304, 306 are configured to receive a different power supply voltage for powering circuitry therein, the first, second and third buffer circuits 302, 304, 306 operate in different voltage domains, such as the respective first, second and third voltage domains 308, 310, and 312.

For example, each of the first, second, and third buffer circuits 302, 304, and 306 include a respective buffer stage 326, 328, and 330. The respective buffer stages 326, 328, and 330 can correspond to one of the first and second buffer stages 122 or 126, as shown in FIG. 1. The buffer stage 326, 328, and 330 can include respective first and second inverters 332, 334, 336, 338, and 340. As shown in FIG. 3, each of the first, second, and third buffer circuits 302, 304, and 306 can further include a respective tri-state inverter 344, 346, and 348. The second input terminals 320, 322, and 324 of each of the first, second, and third buffer circuits 302, 304, and 306 can be coupled to a respective power input of one of the respective first and second inverters 332, 334, 336, 338, and 340. Additionally, the second input terminals 320, 322, and 324 of each of the first, second, and third buffer circuits 302, 304, and 306 can be coupled to a respective power input of one the tri-state inverters 344, 346, and 348. In some examples, each of the tri-state inverters 344, 346, and 348 can correspond to one of the first and second clock selector circuits 124 and 128, as shown in FIG. 1.

For example, the first input voltage can be provided (as shown via a dashed line in FIG. 3) to each of the first and second inverters 332 and 334 and the tri-state inverter 344 to enable operation of the first and second inverters 332 and 334, and the tri-state inverter 344. The second input voltage can be provided (as shown via a dashed line in FIG. 3) to each of the first and second inverters 336 and 338, and the tri-state inverter 346 to enable operation of the first and second inverters 336 and 338, and the tri-state inverter 346. The third input voltage can be provided (as shown via a dashed line in FIG. 3) to each of the first and second inverters 340 and 342, and the tri-state inverter 348 to enable operation of the first and second inverters 340 and 342, and the tri-state inverter 348.

In some examples, an input of the first inverter 332, 336, and 340 can be coupled to a respective one of the respective first input terminals 314, 316, and 318, as shown in FIG. 3. A respective output of each of the first inverters 332, 336, and 340 can be coupled to a corresponding input of one of the second inverters 334, 338, 342. As shown in FIG. 3, a respective output of the second inverter 334, 338, 342 of each of the first, second, and third buffer circuits 302, 304, and 306 can be coupled to a corresponding first output terminal 350, 352, and 354. In some examples, a respective first input of the tri-state inverters 344, 346, and 348 can be coupled to the respective output of one of the first inverters 332, 336, 340. A respective output of the of the tri-state inverters 344, 346, and 348 can be coupled to a corresponding second output terminal 356, 358, 360. In some examples, each of the first, second, and third buffer circuits 302, 304, and 306 can include a respective third input terminal 362, 364, and 366. As shown in FIG. 3, a respective second input of the tri-state inverters 344, 346, and 348 can be coupled to the respective third input terminal 362, 364, and 366.

In some examples, the first inverter 332 of the first buffer circuit 302 can be configured to buffer the first clock signal. The first inverter 332 can be configured to buffer the first clock signal to the second inverter 334. The second inverter 334 can be configured to buffer the output of the first inverter 332 to the first output terminal 350. In some examples, the first clock signal provided by the second inverter 334 can be provided to a subsequent clock receiver circuit (e.g., the second clock receiver circuit 206, as shown in FIG. 1), which can be configured in a same or similar manner as the clock receiver circuit 300, as shown in FIG. 1. Each of the second and third buffer circuits 304 and 306 can be configured in a same or similar manner to the first buffer circuit 302 to provide a respective clock signal, such as the second and third clock signals, as described herein.

In some examples, the second output terminals 356, 358, and 360 can be coupled to a clock output terminal 368 to enable a respective one of the first, second and third clock signals to be provided at the clock output terminal 368. In some examples, the second output terminals 356, 358, and 360 can be omitted and the outputs of the tri-state inverter 344, 346, and 348 can be coupled to the clock output terminal 368. In some examples, one of the first, second, and third clock signals can be provided to the clock output terminal 368. For example, to provide the first clock signal at the clock output terminal 368, the tri-state inverter 344 of the first buffer circuit 302 can be configured to output the first clock signal at the second output terminal 356 in response to receiving a first clock enable signal (labeled as "CLK_EN_1" in FIG. 3). The first clock signal at the second output terminal 356 can be referred to as a first clock output signal (labeled as "CLK_OUT_1" as shown in FIG. 3).

In some examples, to provide the second clock signal at the clock output terminal 368, the tri-state inverter 346 of the second buffer circuit 304 can be configured output the second clock signal at the second output terminal 358 in response to receiving a second clock enable signal (labeled as "CLK_EN_2" in FIG. 3). The second clock signal at the second output terminal 358 of the second buffer circuit 304 can be referred to as a second clock output signal (labeled as "CLK_OUT_2" as shown in FIG. 3). In some examples, to provide the third clock signal at the clock output terminal 368, the tri-state inverter 348 of the third buffer circuit 306 can be configured to output the third clock signal at the third output terminal 360 of the third buffer circuit 306 in response to receiving a third clock enable signal (labeled as "CLK_EN_3" in FIG. 3). The third clock signal at the third output terminal 360 of the third buffer circuit 306 can be referred to as a third clock output signal (labeled as "CLK_OUT_3" as shown in FIG. 3). Thus, the clock receiver circuit 300 can be configured to output of the first, second and third clock output signals at the clock output terminal 368 based on a respective one of the first, second, and third clock enable signals.

Accordingly, by operating the first, second and third buffer circuits 302, 304, and 306 in the respective power domain 308, 310, and 312, crosstalk between the first, second, and third clock signals at the first, second, and third buffer circuits 302, 304, and 306 can be reduced or eliminated. Moreover, because the first, second and third buffer circuits 302, 304, and 306 are operated in the respective power domain 308, 310, and 312, power supply induced jitters can be reduced.

Figure 4:
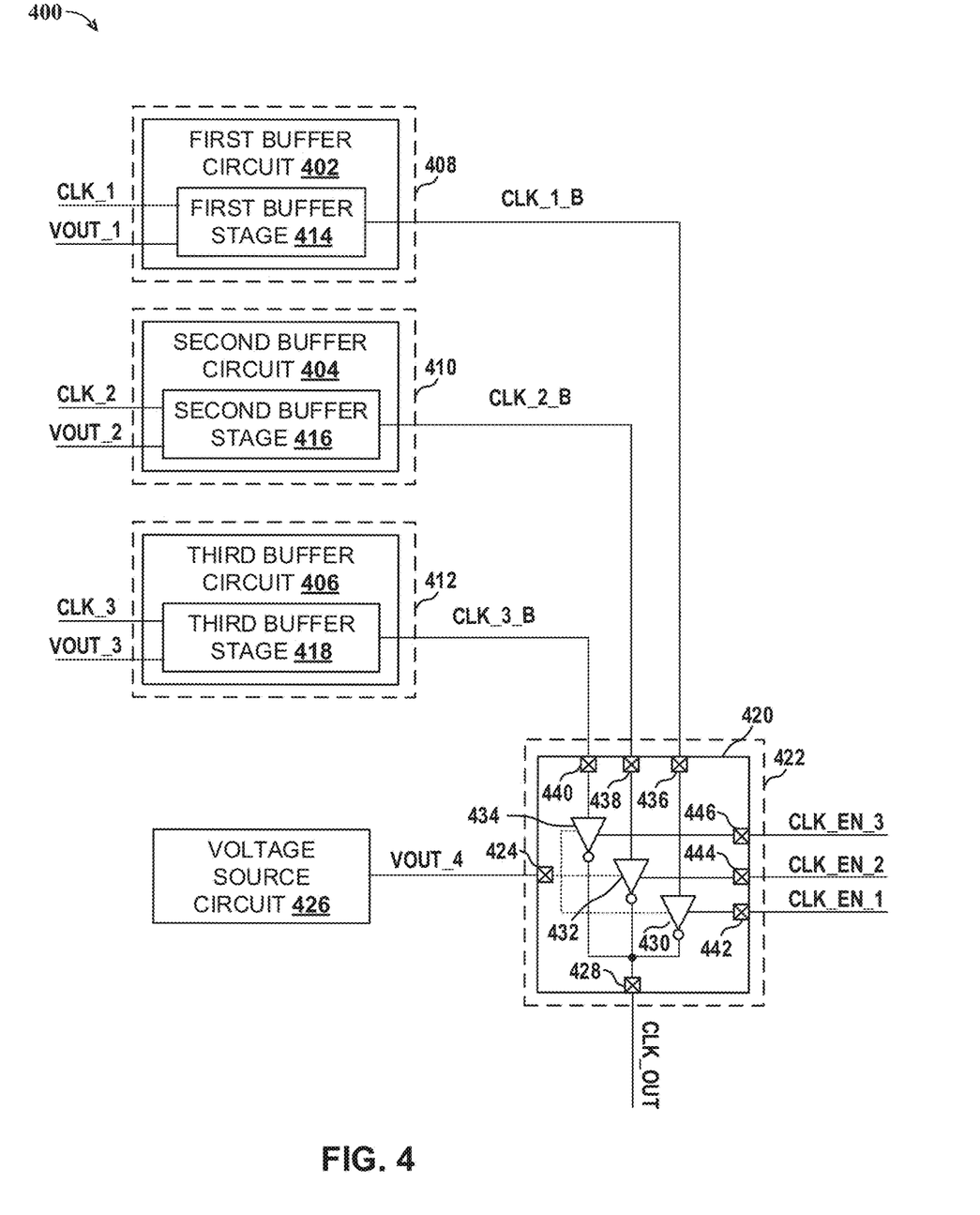
FIG. 4 is an example of a further clock receiver circuit.

FIG. 4 is an example of a clock receiver circuit 400. In some examples, the clock receiver circuit 400 can correspond to at least one of the clock receiver circuits 204, 206, and 208, as shown in FIG. 2. The clock receiver circuit 400 includes a first buffer circuit 402, a second buffer circuit 404, and a third buffer circuit 406. Each of the first, second and third buffer circuits 402, 404, and 406 can be configured to operate in a respective first, second, and third power domain 408, 410, and 412. In some examples, the first, second and third buffer circuits 402, 404, and 406 can include a respective first buffer stage 414, a second buffer stage 416, and a third buffer stage 418. The first, second and third buffer stages 414, 416, and 418 can correspond to the first, second and third buffer stages 346, 348, and 350, as shown in FIG. 3. Thus, each of the first, second and third buffer stages 414, 416, and 418 can operate in a same or similar manner as the first, second and third buffer stages 302, 304, and 306, as shown in FIG. 3. As such, in some examples, references can be made to the example of FIGS. 2-3 in the following description of FIG. 4.

By way of example, the first, second and third buffer stages 414, 416, and 418 can be configured to receive a respective one of a first clock signal (labeled as "CLK_1" in FIG. 4), a second clock signal (labeled as "CLK_2" in FIG. 4), and a third clock signal (labeled as "CLK_3" in FIG. 4). The first, second, and third clock signals can be generated by the clock transmitter circuit 202, as shown in FIG. 2. Each of the first, second and third buffer stages 414, 416, and 418 can be configured to receive a respective one of a first output voltage (labeled as "VOUT_1" in FIG. 4), a second output voltage (labeled as "VOUT_2" in FIG. 4), and a third output voltage (labeled as "VOUT_3" in the FIG. 4). Each of the first, second, and third output voltages can be generated by a respective voltage source circuit, such as the first, second, and third voltage source circuits 240, 244, and 248, as shown in FIG. 2. Thus, each of the first, second, and third output voltages can be a different output voltage.

The first output voltage can be used at the first buffer circuit 402 to power the first buffer stage 414 and thus circuitry therein to enable the first buffer stage 414 to provide a first buffered clock signal (labeled as "CLK_1_B in FIG. 4). The first buffered clock signal can be similar to the first clock signal and thus can have a similar duty cycle. The second output voltage can be used at the second buffer circuit 404 to power the second buffer stage 416 and thus circuitry therein to enable the second buffer stage 416 to provide a second buffered clock signal (labeled as "CLK_2_B in FIG. 4). The second buffered clock signal can be similar to the second clock signal and thus can have a similar duty cycle. The third output voltage can be used at the third buffer circuit 406 to power the third buffer stage 418 and thus circuitry therein to enable the third buffer stage 418 to provide a second buffered clock signal (labeled as "CLK_3_B in FIG. 4). The third buffered clock signal can be similar to the third clock signal and thus can have a similar duty cycle.

In some examples, the clock receiver circuit 400 includes a clock output circuit 420. The clock output circuit 420 can be configured to operate in a fourth power domain 422 different from the first, second, and third power domains. In some examples, the clock output circuit 420 includes a first input terminal 424. The clock output circuit 422 can be configured to receive a fourth output voltage (labeled as "VOUT_4" in FIG. 4) at the first input terminal 424. The fourth output voltage can be generated by a voltage source circuit 426. The fourth output voltage can be different from the first, second, and third output voltages. The fourth output voltage can be used at the clock output circuit 420 to power the clock output circuit 420 and thus circuitry therein to enable the clock output circuit 420 to provide a clock output signal (labeled as "CLK_OUT" in FIG. 4) at an output terminal 428 based on one of first, second, and third buffered clock signals. Thus, the clock output signal can be similar (e.g., have a similar duty cycle) to one of first, second, and third buffered clock signals. While the example of FIG. 4 illustrates the clock receiver circuit 400 including the voltage source circuit 426 in other examples the voltage source circuit 426 can be external to the clock receiver circuit 400.

In some examples, the clock output circuit 402 can include first, second, and third tri-state inverters 430, 432 and 434. The fourth input voltage at the first input terminal 424 can be provided (as shown via a dashed line in FIG. 4) to each of the first, second, and third tri-state inverters 430, 432 and 434 to enable operation of the tri-state inverters 430, 432 and 434. In some examples, the clock output circuit 420 can include a second input terminal 436 to receive the first buffered clock signal, a third input terminal 438 to receive the second buffered clock signal, and a fourth input terminal 440 to receive the third buffered clock signal. The second, third and fourth input terminals 436, 438, and 440 can be coupled to a respective first input of one of the first, second, and third tri-state inverters 430, 432, and 434. A respective second input of the first, second, and third tri-state inverters 430, 432, and 434 can be coupled to the first input terminal 424. Thus, the first, second, and third tri-state inverters 430, 432, and 434 can be configured to receive the fourth output voltage, such that the first, second, and third tri-state inverters 430, 432, and 434 can be powered to operate. A respective output of the first, second, and third tri-state inverters 430, 432, and 434 can be coupled to the output terminal 428. In some examples, the clock output circuit 420 includes a fifth input terminal 442, a sixth input terminal 444, and a seventh input terminal 446. As shown in FIG. 3, a respective third input of the first, second, and third tri-state inverters 430, 432, and 434 can be coupled to one of the fifth, sixth and seventh input terminals 442, 444, and 446.

In some examples, one of the first, second, and third buffered clock signals can be provided to the output terminal 428. For example, the tri-state inverter 430 can be configured output the first buffered clock signal at the clock output terminal 428 as the clock output signal in response to receiving a first clock enable signal (labeled as "CLK_EN_1" in FIG. 4). The first clock enable signal can be received at the fifth input terminal 442. In some examples, the tri-state inverter 432 can be configured output the second buffered clock signal at the output terminal 428 as the clock output signal in response to receiving a second clock enable signal (labeled as "CLK_EN_2" in FIG. 4). The second clock enable signal can be received at the sixth input terminal 444. In some examples, the tri-state inverter 434 can be configured output the third buffered clock signal at output terminal 428 as the clock output signal in response to receiving a third clock enable signal (labeled as "CLK_EN_3" in FIG. 4). The third clock enable signal can be received at the seventh input terminal 446.

In examples wherein the clock receiver circuit 400 is employed in or associated with a communication system, the output terminal 428 can be coupled to a transceiver of the communication system, such as described herein. In some examples, the transceiver can be associated with or include a SerDes circuit and enable the SerDes circuit to be configured with a flexible data rate based on the select clock output signal.

Figure 5:
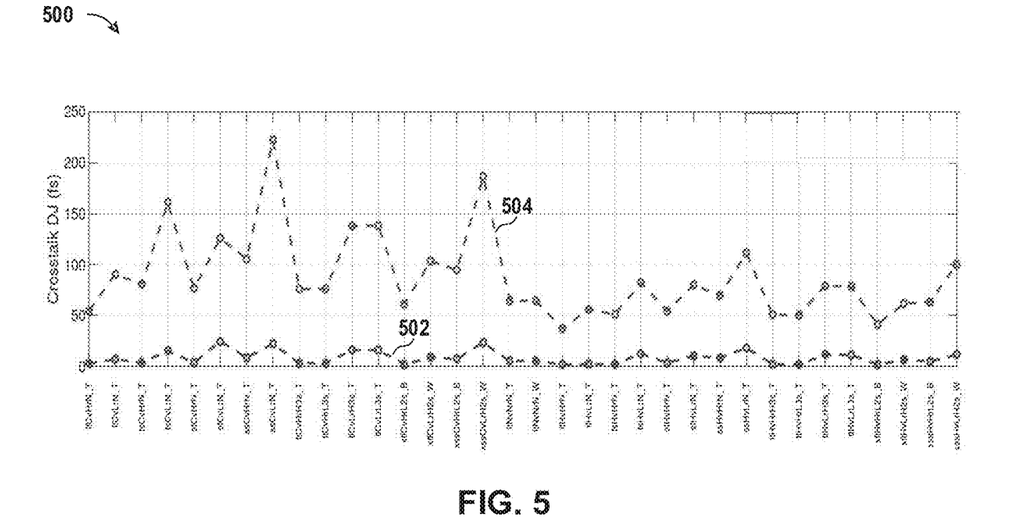
FIG. 5 is an example of a crosstalk jitter diagram.

FIG. 5 is an example a crosstalk deterministic jitter diagram 500 associated with clock receiver circuits, such as the clock receiver circuits 300 and 400, as shown in respective FIGS. 3 and 4. Thus, in some examples, references can be made to the example of FIGS. 3 and 4 in the following description of FIG. 5. The crosstalk deterministic jitter diagram 500 includes a first crosstalk jitter plot 502 and a second crosstalk jitter plot 504. By way of example, a y-axis of the crosstalk deterministic jitter diagram 500 can represent a cross talk deterministic jitter (DJ) in femtoseconds (fs), and an x-axis of deterministic jitter cross talk diagram 500 can be representative of different process, temperature, and voltage conditions.

By way of example, the deterministic jitter cross talk diagram 500 shows an amount of crosstalk jitter for a selected clock output signal. In an example (referred to herein as a "given example"), each of the clock receiver circuits 300 and 400 can be configured to receive a first clock signal, a second clock signal, and a third clock signal. In the given example, the first clock signal can have a frequency of 7 Gigahertz (GHz), the second clock signal can have a frequency of 5.6 GHz, and the third clock signal can have a frequency of 4.67 GHz. The first, second, and third clock signals can be generated by the clock transmitter circuit 202, as shown in FIG. 2. As described herein, one of the first, second, and third clock signals can be selected and provided as the selected clock output signal. In the given example, the clock receiver circuit 300 can be configured to select the first clock signal and provide the first clock signal as the selected clock output signal, and the clock receiver circuit 400 can be configured to select the first clock signal and provide the first clock signal as the selected clock output signal. The first crosstalk jitter plot 502 can characterize crosstalk jitter induced in the first clock signal provided by the clock receiver circuit 300, and the second crosstalk jitter plot 504 can characterize crosstalk jitter induced in the first clock signal provided by the second clock receiver circuit 400 over different operating conditions (e.g., different temperatures, processes, and voltages). As shown by the deterministic jitter crosstalk diagram 500, the first clock signal provided by clock receiver circuit 300 has a reduced amount of jitter over different operation conditions in contrast to the first clock signal provided by the clock receiver circuit 400.

Figure 6:
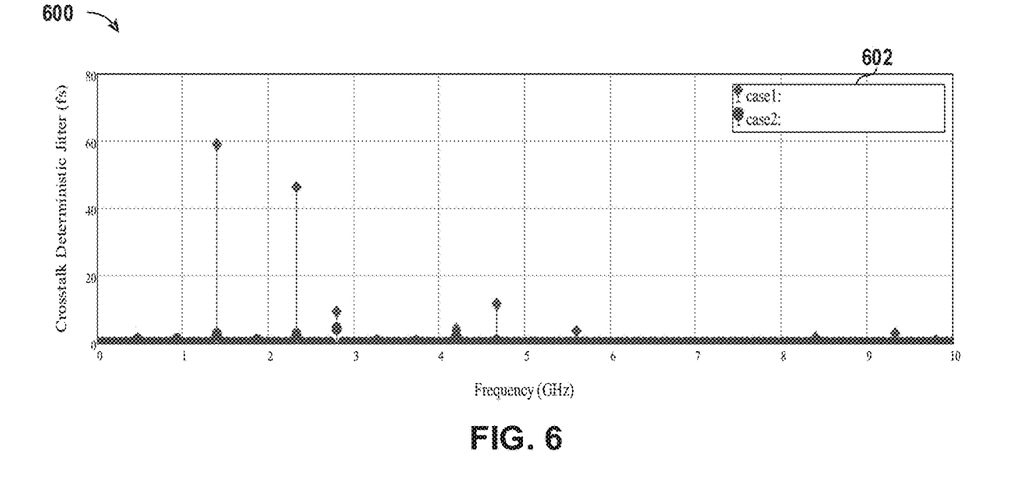
FIG. 6 is an example of a frequency spectrum diagram.

FIG. 6 is an example of frequency spectrum diagram 600 associated with clock receiver circuits, such as the clock receiver circuits 300 and 400, as shown in respective FIGS. 3 and 4. Thus, in some examples, references can be made to the example of FIGS. 3 and 4 in the following description of FIG. 6. By way of example, a y-axis of the frequency spectrum diagram 600 can represent a crosstalk DJ in fs, and an x-axis of the frequency spectrum diagram 600 represent frequencies in GHz. Continuing with the given example herein, a frequency response of the clock receiver circuits 300 and 400 can be generated. As shown in the frequency spectrum diagram 600, the selected clock output signal provided by the clock receiver circuit 400 can include frequency components that induce a greater amount of crosstalk jitter in contrast to frequency components of the selected clock output signal provided by the clock receiver circuit 300. The frequency components of the selected clock output signal provided by each of the clock receiver circuit 300 and 400 can be harmonic frequency components. The frequency spectrum diagram 600 includes a legend 602, with a circle reference to identify frequency components of the selected clock output signal provided by the clock receiver circuit 300. The legend 602 further includes a diamond reference to identify frequency components of the selected clock output signal provided by the clock receiver circuit 400. As shown in FIG. 6, the frequency components of the selected clock output signal provided by the clock receiver circuit 400 are greater than the frequency components of the selected clock output signal provided by the clock receiver circuit 300.

Figure 7:
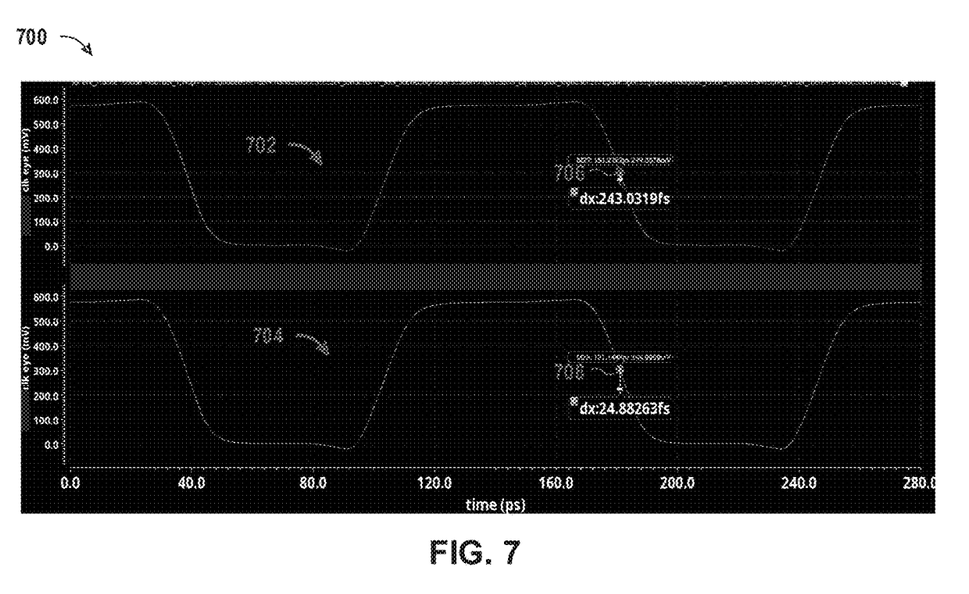
FIG. 7 is an example of an eye diagram.

FIG. 7 shows an example of an eye diagram 700. The eye diagram 700 includes a first eye plot 702 and a second eye plot 704. The first eye plot 702 can be associated with an operation of the clock receiver 400, as shown in FIG. 4, and the second eye plot 704 can be associated with the operation of the clock receiver circuit 300, as shown in FIG. 4. As illustrated in the example of FIG. 7, a y-axis of the eye diagram 700 can represent a voltage in millivolts (mV) and an x-axis of the eye diagram 700 can represent a time in picoseconds (ps). The first eye plot 702 can characterize a performance of at least one selected clock output signal provided by the clock receiver circuit 400, as shown in FIG. 4. The second eye plot 704 can characterize a performance of at least one selected clock output signal provided by the clock receiver circuit 300, as shown in FIG. 3. As illustrated at 706, a timing error (e.g., jitter) can be 243.0319 fs for the clock receiver 400. As illustrated at 708, a timing error (e.g., jitter) can be 24.88263 fs for the clock receiver circuit 300. Thus, clock receiver circuit 300 can exhibit a reduced amount of jitter in contrast to the clock receiver 400.

Figure 8:
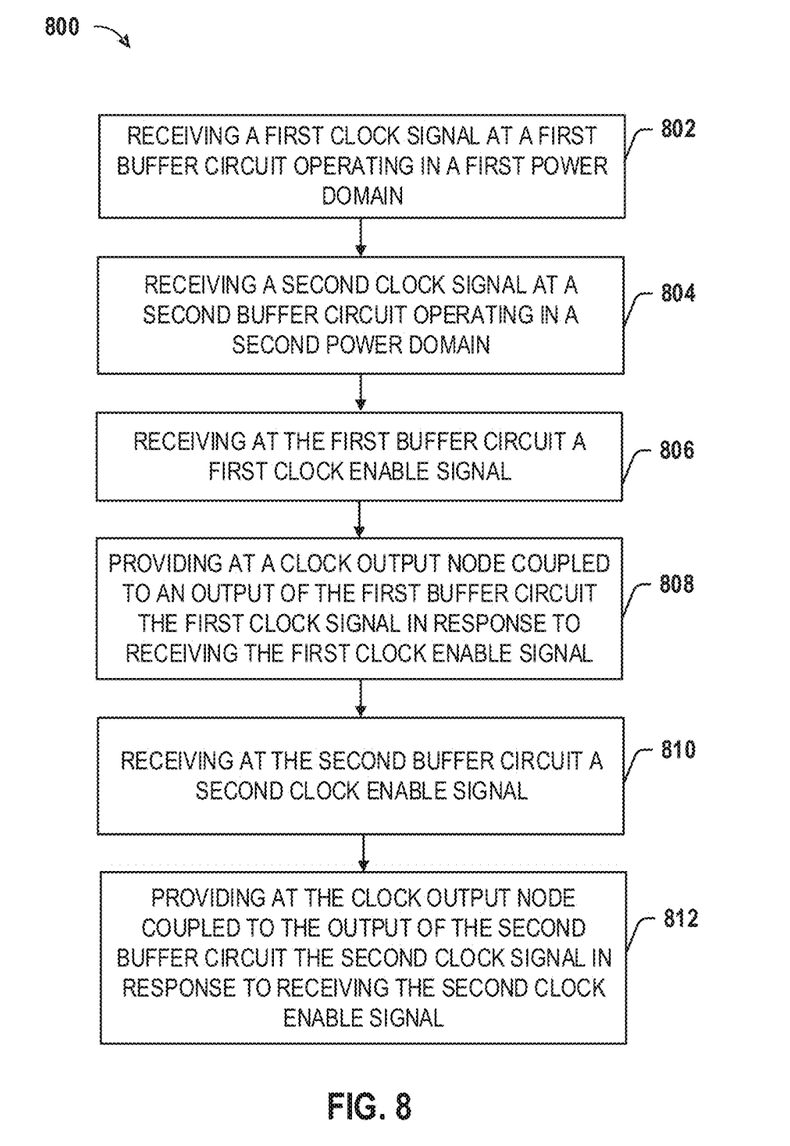
FIG. 8 is an example of a method for clock signal distribution.

In view of the foregoing structural and functional features described above, an example method will be better appreciated with references to FIG. 8. While, for purposes of simplicity of explanation, the example method of FIG. 8 is shown and described as executing serially, it is to be understood and appreciated that the example method is not limited by the illustrated order, as some actions could in other examples occur in different orders, multiple times and/or concurrently from that shown and described herein.

FIG. 8 is an example of a method 800 for clock signal distribution. The method 800 can be implemented by a clock receiver circuit, such as the clock receiver circuit 100, as shown in FIG. 1, one of the clock receiver circuits 204, 206, and 208, as shown in FIG. 2, or the clock receiver circuit 300, as shown in FIG. 1. The method 800 can begin at 802 by receiving during a first period of time a first clock signal at a first buffer circuit (e.g., the first buffer circuit 118, as shown in FIG. 1) operating in a first power domain. At 804, receiving during the first period of time a second clock signal at a second buffer circuit (e.g., the second buffer circuit 120, as shown in FIG. 1) operating in a second power domain. At 806, receiving during the first period of time at the first buffer circuit a first clock enable signal (e.g., the clock enable signal CLK_EN_1, as shown in FIG. 1). At 808, providing during the first period of time at a clock output terminal of the clock receiver circuit the first clock signal in response to receiving the first clock enable signal. At 810, receiving during a second period of time at the second buffer circuit a second clock enable signal (e.g., the clock enable signal CLK_EN_2, as shown in FIG. 1). At 812, providing during the second period of time at the clock output terminal of the clock receiver circuit the second clock signal in response to receiving the second clock enable signal.

As used herein, the term "circuit" can include a collection of active and/or passive elements that perform an electronic circuit function, such as an analog circuit and/or digital circuit. Additionally or alternatively, for example, the term "circuit" can include an IC where all or some of the circuit elements are fabricated on a common substrate (e.g., semiconductor substrate, such as a die or chip) or within a common package herein. For example, circuitry of a clock receiver circuit or a clock transmitter circuit as described herein (e.g., buffer circuits, scalers, buffer stages, and the like) can be implemented on a semiconductor substrate. Additionally, the term "couple" is used throughout the specification. The term may cover connections, communications, or signal paths that enable a functional relationship consistent with the description of the present disclosure. For example, if device A generates a signal to control device B to perform an action, in a first example device A is configured to device B, or in a second example device A is configured to device B through intervening component C if intervening component C does not substantially alter the functional relationship between device A and device B such that device B is controlled by device A via the control signal generated by device A.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
   a first buffer circuit configured to receive a first clock signal and a first output voltage, the first buffer circuit being configured to operate in a first voltage domain based on the first output voltage;
   a second buffer circuit configured to receive a second clock signal, the second buffer circuit being configured to operate in a second voltage domain based on the second output voltage, the first voltage domain being different from the second voltage domain, wherein the first and second clock signals are generated based on a master clock signal and have different frequencies, and wherein one of the first and second buffer circuits is configured to provide one of the first and second clock signals as a clock output signal at a clock output terminal in response to a clock enable signal.

2. The circuit of claim 1, further comprising an output terminal, and the first buffer circuit comprises a buffer stage and a clock selector circuit, the buffer stage and the clock selector circuit being operated in the first voltage domain based on the first output voltage, the buffer stage being configured to buffer the first clock output signal and provide a buffered first clock output signal at the output terminal.

3. The circuit of claim 2, wherein the output terminal is a first output terminal, the buffer stage is a first buffer stage, the clock selector circuit is a first clock selector circuit, and the circuit further comprising a second output terminal, the second buffer circuit comprising a second buffer stage and a second clock selector circuit, the second buffer stage and the second clock selector circuit being operated in the second voltage domain based on the second output voltage, the second buffer stage being configured to buffer the second clock output signal and provide a buffered second clock output signal at the second output terminal.

4. The circuit of claim 3, wherein the first buffer stage is configured to provide the first clock output signal to the first clock selector circuit and the second buffer stage is configured to provide the second clock output signal to the second clock selector circuit.

5. The circuit of claim 4, wherein the first clock selector circuit is configured to provide the first clock signal as the clock output signal at the clock output terminal in response to the clock enable signal.

6. The circuit of claim 4, wherein the second clock selector circuit is configured to provide the second clock signal as the clock output signal at the clock output terminal in response to the clock enable signal.

7. The circuit of claim 4, wherein the clock enable signal is a first clock enable signal, the first clock selector circuit being configured to provide the first clock signal during a first period of time as the clock output signal at the clock output terminal based on the first clock enable signal, and the second clock selector circuit being configured to provide the second clock signal during a second period of time as the clock output signal at the clock output terminal based on the second clock enable signal.

8. The circuit of claim 4, further comprising a clock transmitter circuit configured to provide the first and second clock signals based on the master clock signal.

9. The circuit of claim 8, wherein the first and second buffer stages are first and second receiver buffer stages, and the clock transmitter circuit comprises a clock divider circuit, a first transmitter buffer stage and a second transmitter buffer stage, the clock divider circuit being configured to generate first and second intermediate clock signals based on the master clock signal, the first transmitter buffer stage be configured to buffer the first intermediate clock signal to provide the first clock signal, and the second transmitter buffer stage being configured to buffer the second intermediate clock signal to provide the second clock signal, the first transmitter buffer stage being configured to operate in the first voltage domain based on the first output voltage, and the second transmitter buffer stage being configured to operate in the second voltage domain based on the second output voltage.

10. The circuit of claim 9, wherein the clock divider circuit includes a first scaler circuit and a second scaler circuit, the first scaler circuit being configured to operate in the first voltage domain based on the first output voltage, and the second scaler circuit being configured to operate in the second voltage domain based on the second output voltage.

11. The circuit of claim 10, further comprising a first clock receiver circuit and a second clock receiver, the first clock receiver comprising the first buffer circuit and the second buffer circuit, the second clock receiver comprising a third buffer circuit, and a fourth buffer circuit, the third buffer circuit being configured to receive the first clock signal and the first output voltage, the first buffer circuit being configured to operate in the first voltage domain based on the first output voltage, the fourth buffer circuit being configured to receive the second clock signal and the second output voltage, the second buffer circuit being configured to operate in the second voltage domain based on the second output voltage.

12. The circuit of claim 11, wherein the clock enable signal is a first clock enable signal and the clock output terminal is a first clock output terminal, the second receiver circuit comprising a second clock output terminal, the first clock signal being provided to the third buffer circuit by the first buffer circuit, and the second clock signal being provided to the fourth buffer circuit by the second buffer circuit, and the first buffer circuit is configured to provide the first clock signal at the first clock output terminal in response to the first clock enable signal, and the fourth buffer circuit being configured to provide the second clock signal at the second clock output terminal in response to a second clock enable signal.

13. A system comprising:
a clock transmitter circuit configured to generate first and second clock signals based on a master clock signal, wherein each of the first and second clock signals have a different frequency;
a clock receiver circuit comprising:
  a clock output terminal;
  a first buffer circuit operating in a first voltage domain and configured to receive the first clock signal;
  a second buffer circuit operating in a second voltage domain and configured to receive the second clock signal, and
  wherein one of the first and second buffer circuits is configured to provide one of the first and second clock signals as a clock output signal at the clock output terminal in response to a clock enable signal.

14. The system of claim 13, wherein the first buffer circuit comprises a first output terminal, a first buffer stage, and a first clock selector circuit, and the second buffer circuit comprises a second output terminal, a second buffer stage, and a second clock selector circuit, the first buffer stage being configured to provide the first clock signal to the clock selector circuit and the second buffer stage being configured to provide the second clock signal to the second clock selector circuit.

15. The system of claim 14, wherein the clock enable signal is a first clock enable signal, and one of:
the first clock selector circuit is configured to provide the first clock signal as the clock output signal at the clock output terminal in response to the first clock enable signal; and
the second clock selector circuit is configured to provide the second clock signal as the clock output signal at the clock output terminal in response to the second clock enable signal.

16. The system of claim 15, wherein the clock receiver circuit comprises a first output terminal and a second output terminal, the first buffer stage and the first clock selector circuit being operated in the first voltage domain based on the first output voltage, the first buffer stage being configured to provide the first clock signal at the first output terminal, the second buffer stage and the second clock selector circuit being operated in the second voltage domain based on the second output voltage, the second buffer stage being configured to provide the second clock signal at the second output terminal.

17. The system of claim 16, wherein the first and second buffer stages are first and second receiver buffer stages, and the clock transmitter circuit comprises a clock divider circuit, a first transmitter buffer stage and a second transmitter buffer stage, the clock divider circuit being configured to generate first and second intermediate clock signals based on the master clock signal, the first transmitter buffer stage being configured to buffer the first intermediate clock signal to provide the first clock signal, and the second transmitter buffer stage being configured to buffer the second intermediate clock signal to provide the second clock signal, the first transmitter buffer stage being configured to operate in the first voltage domain based on the first output voltage, and the second transmitter buffer stage being configured to operate in the second voltage domain based on the second output voltage.

18. The system of claim 17, wherein the clock divider circuit includes a first scaler circuit and a second scaler circuit, the first scaler circuit being configured to operate in the first voltage domain based on the first output voltage, and the second scaler circuit being configured to operate in the second voltage domain based on the second output voltage.

19. A method comprising:
receiving during a first period of time a first clock signal at a first buffer circuit operating in a first power domain;
receiving during the first period of time a second clock signal at a second buffer circuit operating in a second power domain;
receiving during the first period of time at the first buffer circuit a first clock enable signal;
providing during the first period of time at a clock output terminal of the clock receiver circuit the first clock signal in response to receiving the first clock enable signal;
receiving during a second period of time at the second buffer circuit a second clock enable signal; and
providing during the second period of time at the clock output terminal of the clock receiver circuit the second clock signal in response to receiving the second clock enable signal.

20. The method of claim 19,
receiving, at the first buffer circuit, a first output voltage generated by a first voltage source circuit to cause the first buffer circuit to operate in the first power domain; and
receiving, at the second buffer circuit, a second output voltage generated by a second voltage source circuit to cause the second buffer circuit to operate in the second power domain.

* * * * *